United States Patent
Dedic et al.

(10) Patent No.: US 12,107,544 B1
(45) Date of Patent: Oct. 1, 2024

(54) CLOCK BUFFER INDUCTOR

(71) Applicant: Acacia Communications, Inc., Maynard, MA (US)

(72) Inventors: Ian Dedic, London (GB); Gavin Allen, Greenwood (AU); David Enright, Maldon (GB); Guojun Ren, San Jose, CA (US)

(73) Assignee: ACACIA COMMUNICATIONS, INC., Maynard, MA (US)

( * ) Notice: Subject to any disclaimer, the term of this patent is extended or adjusted under 35 U.S.C. 154(b) by 0 days.

(21) Appl. No.: 16/685,063

(22) Filed: Nov. 15, 2019

(51) Int. Cl.
*H01F 27/28* (2006.01)
*H03B 5/12* (2006.01)

(52) U.S. Cl.
CPC ........... *H03B 5/1259* (2013.01); *H01F 27/28* (2013.01); *H03B 5/1268* (2013.01)

(58) Field of Classification Search
CPC ...... H03B 5/1259; H03B 5/1268; H01F 27/28
USPC ........................................ 336/200, 232, 192
See application file for complete search history.

(56) References Cited

U.S. PATENT DOCUMENTS

| | | | | |
|---|---|---|---|---|
| 5,184,103 A * | 2/1993 | Gadreau | ............. | H01F 27/2804 336/200 |
| 2004/0140528 A1 * | 7/2004 | Kim | ................... | H01L 23/5227 257/537 |
| 2005/0052272 A1 * | 3/2005 | Tiebout | ................... | H01L 27/08 336/232 |
| 2006/0197642 A1 * | 9/2006 | Hargrove | ............ | H01F 17/0013 336/200 |
| 2007/0085649 A1 * | 4/2007 | Park | ..................... | H01L 23/5227 336/200 |
| 2007/0115086 A1 * | 5/2007 | Cairo Molins | ......... | H01F 21/12 336/200 |
| 2008/0129434 A1 * | 6/2008 | Khajehpour | ............ | H01F 21/12 336/200 |
| 2010/0225408 A1 * | 9/2010 | Rofougaran | ......... | H03B 5/1268 331/181 |
| 2011/0248811 A1 * | 10/2011 | Kireev | ................ | H01L 23/5227 336/200 |
| 2012/0286889 A1 * | 11/2012 | Park | ..................... | H03B 5/1268 331/117 FE |
| 2014/0055120 A1 * | 2/2014 | Kubota | ................. | H02M 3/158 323/311 |
| 2014/0152413 A1 * | 6/2014 | Fu | ........................... | H01F 41/06 336/192 |
| 2017/0117083 A1 * | 4/2017 | Su | ........................... | H01F 27/28 |
| 2017/0141752 A1 * | 5/2017 | Hino | ........................ | H04B 1/40 |

* cited by examiner

*Primary Examiner* — Shawki S Ismail
*Assistant Examiner* — Kazi S Hossain
(74) *Attorney, Agent, or Firm* — K&L GATES LLP

(57) ABSTRACT

An apparatus comprising two inductors; wherein the two inductors are layered on top of each other in different layers of metal of a circuit; wherein each inductor of the inductor has a set of turns; wherein the current path of the two inductors is in the same direction.

16 Claims, 7 Drawing Sheets

CLOCK BUFFER INDUCTOR

BACKGROUND

A clock may be used to provide a timing signal in a digital circuit.

BRIEF DESCRIPT OF THE FIGURES

Various aspects and embodiments of the application will be described with reference to the following example embodiments. It should be appreciated that the figures are not necessarily drawn to scale.

Figure 5:
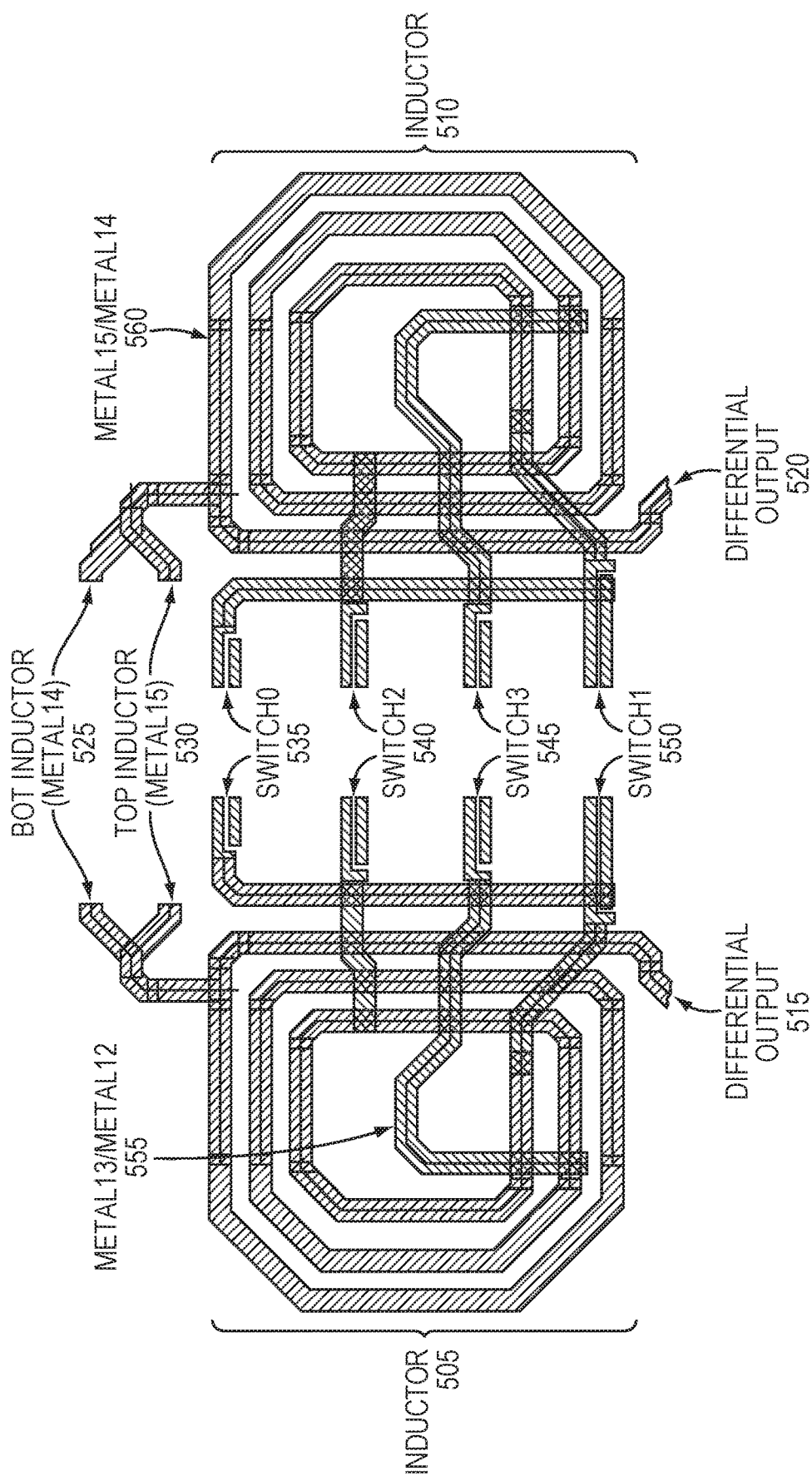
FIG. 5 is an alternative simplified illustration of two inductors in placed over each other in different layers of metal with switches connecting different turns of the inductors, in accordance with an embodiment of the present disclosure.
Figure 6:
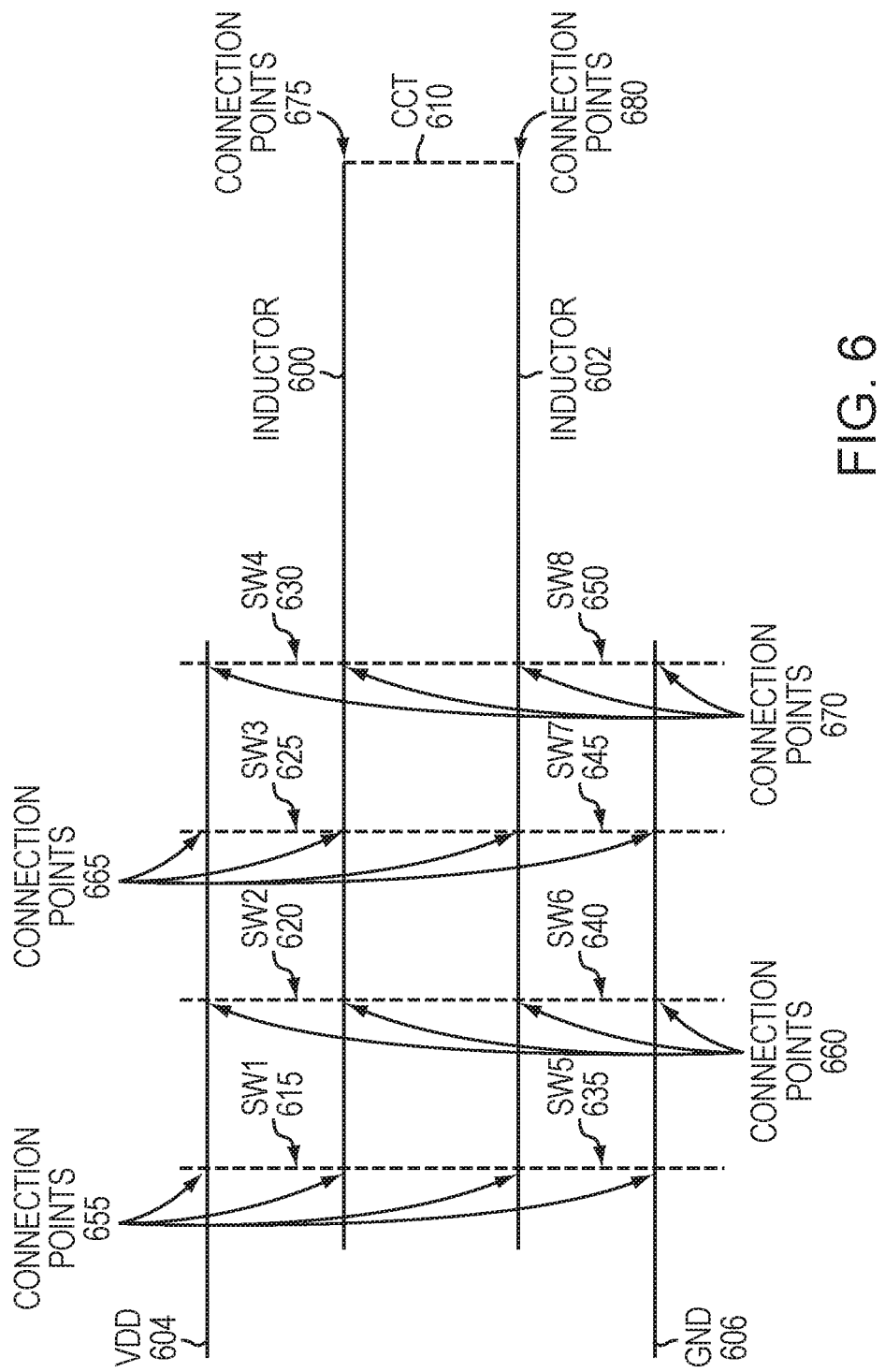
Figure 7:
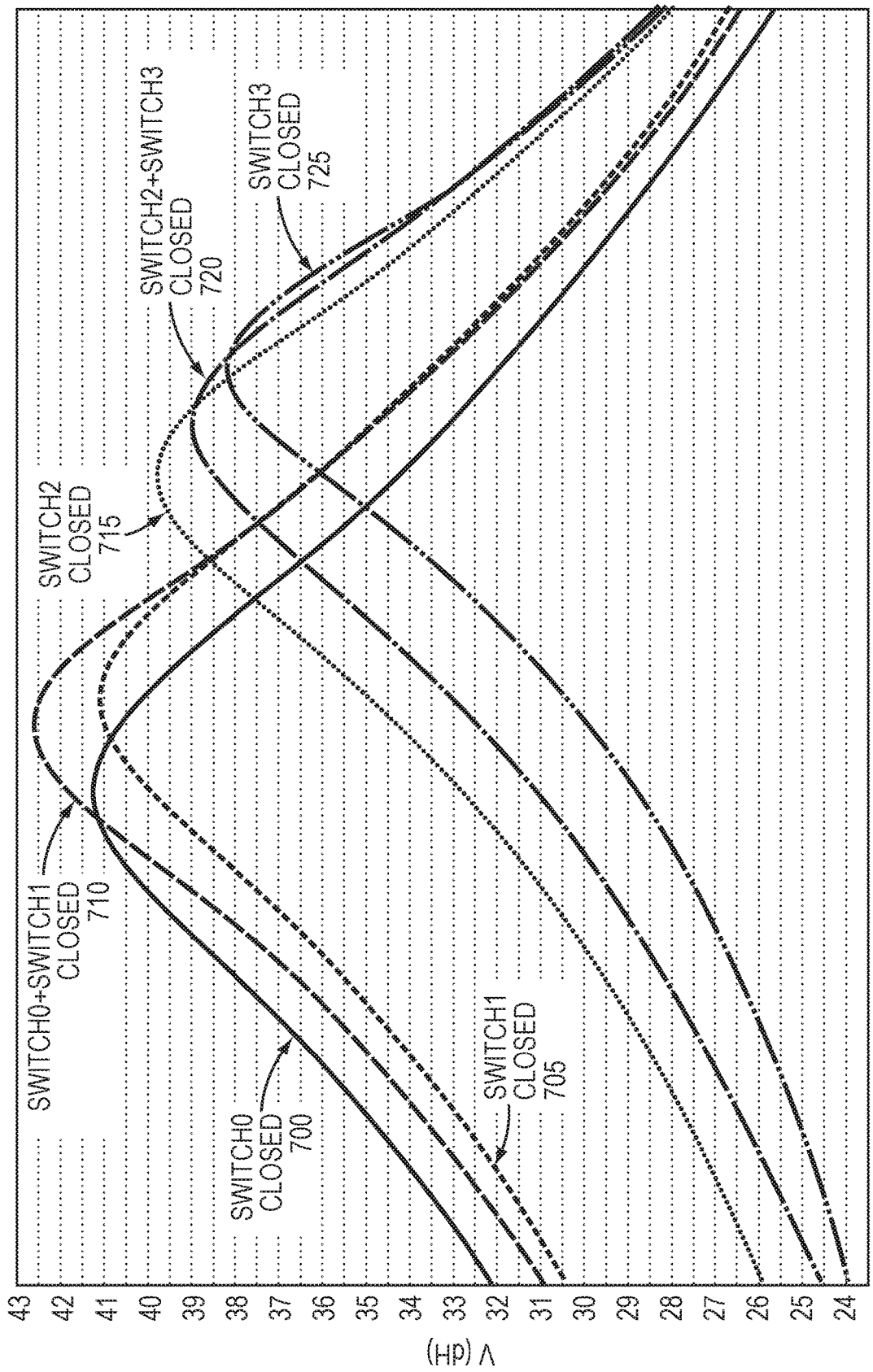

FIG. 6 is a simplified illustration of turns of an inductor unwrapped for illustration purposes to show a stacked inductor with several tap points on the supply/ground side, where the number of turns can be varied depending which switch(es) are closed to connect to VDD/GND, in accordance with an embodiment of the present disclosure; and FIG. 7 is a graph depicting the response of the inductor of FIG. 5 to having different switches activated, in accordance with an embodiment of the present disclosure.

SUMMARY

An apparatus comprising two inductors; wherein the two inductors layered on top of each other in different layers of metal of a circuit; wherein each inductor of the inductor has a set of turns; wherein the current path of the two inductors is in the same direction.

DETAILED DESCRIPTION

In many embodiments, a communication or transmission system may include a transmitter and a receiver. In some embodiments, a communication system may include two transceivers. In most embodiments, a transmission, such as a set of bits, may be encoded in a signal at a transmitter. In most embodiments, a transmitter may transmit an encoded signal to a receiver. In certain embodiments, a receiver may receive a signal from a transmitter and decode the signal into information. In almost all embodiments, there may be a number of conditions that may impact the signal which may make it hard to decode the information. In certain embodiments, a signal may be transmitted over an RF connection. In other embodiments, a signal may be transmitted over an optical link. In further embodiments, an optical link may utilize a coherent signal.

In some embodiments, in a coherent optical system, a digital electrical signal may be received. In certain embodiments, a digital electrical signal may be converted to an analog signal. In many embodiments, an analog signal may be converted to an optical signal. In certain embodiments, an optical signal may be transmitted over an optical link. In almost all embodiments, a received optical signal may need to be converted to an analog signal, which may need to be converted to an electrical signal.

In most embodiments, a coherent optical communication system may have high data rates. In almost all embodiments, it may be necessary to divide data received into discrete time intervals. In many embodiments, a clock on a transmitter may determine when a signal is sent out. In some embodiments, an analog to digital converter may determine when samples are taken and converted into a digital format. In many embodiments, in a coherent optical system it may be necessary to do a conversion between a digital signal and an analog signal at many gigabaud per second. In most embodiments, in a coherent optical signal, it may be necessary to convert an optical signal to an analog signal at many gigabaud per second. In some embodiments, in a coherent optical system, it may be necessary to convert an analog signal to an electrical signal at many gigabaud per second.

In most embodiments in a coherent optical system, a conversion between digital to analog, analog to optical, optical to analog, and analog to digital may need to run at speeds of 50-60 gigabaud or faster per second. In many embodiments, accuracy of a conversion may need to be high and signal to noise distortion of the signal may need to be low. In almost all embodiments, accurate conversion of a signal may require an accurate clock at both a transmission site and at a receive site. In most embodiments, a clock may need to run at a high speed and have very high slew rates. In certain embodiments, slew rate may be 2 pi times the frequency of the clock. In many embodiments, if a clock moves in time, such as jittering backward or forward in time, this may introduce a time error into a communication system which may then introduce a voltage error which may degrade the accuracy of a communication. In some embodiments herein, jitter may refer to phase noise (i.e. random, undesired fluctuations) in a wave produced by a voltage-controlled oscillator (VCO).

In some embodiments, there may be 20 picoseconds between transmitted or received data samples. In certain embodiments, a clock may be used to denote the time between samples. In many embodiments, a same amount of jitter may create bigger voltage errors at higher frequencies. In most embodiments, a clock may need to be distributed to each circuit or device that uses the clock. In many embodiments, a distribution of a clock may need to cover a big area. In certain embodiments, distributing a clock of a VCO across a distance may take power. In almost all embodiments, it may beneficial to be able to generate and distribute a clock signal without dissipating power and keeping jitter to a minimum.

In many embodiments, a clock may need to provide a signal to denote a sampling time. In certain embodiments, a clock may need to be distributed to a number of different locations performing a conversion of a signal. In most embodiments, it may require power to distribute a clock to different locations or circuits that use the clock. In further embodiments, it may require power to drive or distribute a clock.

In many embodiments, a clock may be a voltage-controlled oscillator (VCO). In certain embodiments, a VCO may be a ring oscillator. Typically, a ring oscillator may be used as a clock for a digital signal processor (DSP). In other embodiments, a VCO may have a resonance tank or tank. In some embodiments, a tank may be formed by a resonance circuit with an inductor (L) and a capacitor (C).

In many embodiments, an LC tank type VCO may be used to provide a clock for an analog to digital converter (ADC) or a digital to analog converter (DAC). In some embodiments, Applicants have realized that ring oscillators may be used at lower frequencies and are able to drive a higher load. In most embodiments, Applicants have realized that a ring oscillator may not be able to function efficiently at higher frequencies or when higher speed conversions are necessary, such as those required in an ADC or DAC of optical communications. In certain embodiments, it may not be possible to use a ring oscillator VCO at higher frequencies as the delay around the ring cannot be made small enough. In most embodiments, Applicants have realized it may be beneficial to use an LC tank type VCO to enable a clock that operates at higher frequencies. Conventionally, ring oscillators require much higher power consumption than LC oscillators for the same level of phase noise/jitter.

In certain embodiments, with an LC tank VCO, energy in the tank may flow between the L and the C at a given phase. In many embodiments, phase of a flow of energy around a tank of a VCO may denote a clock cycle. In most embodiments, tanks are referred to as having a Q ratio. In many embodiments, Q refers to the ratio between energy circulating around a tank and the amount of energy that is lost each time the energy flows around the tank. In most embodiments, a tank with a higher Q ratio is preferable as higher Q indicates lower energy loss for each clock cycle.

In many embodiments, it may be beneficial to generate a clock, buffer it, and distribute the clock signal using low power while limiting the amount of jitter in the clock signal. Typically, to distribute a clock signal to multiple circuits or locations, it may be necessary to buffer the clock signal. Generally, each time you add a buffer, it may be necessary to add more power. Conventionally, a buffer adds noise and jitter into a system as it is an analog component. Usually, adding a buffer to a VCO may add to a load of the VCO. In most embodiments, an ideal buffer may have no input load, no capacitance, and be without a high Q.

In certain embodiments, it may be beneficial to use an H-Q clock buffer for a VCO. In some embodiments, a clock buffer may be used in a back-end or output stage. In some embodiments, a clock buffer may need to have at least two inductors. In certain embodiments, inductors may be used to block DC voltages. Typically, two separate inductors that are not located in proximity to each other are used to form part of a clock buffer. Usually, these two inductors are connected in parallel in a circuit. In most embodiments, Applicants have realized that two inductors located in different parts of a circuit connected in parallel may create a combined capacitance in the circuit. In certain embodiments, Applicants have realized if the two inductors are in parallel in a circuit, one may need two inductors of size 2L to get a single inductor of size L. Generally, two inductors of 2L in parallel look like a single 1L inductor in a residence circuit. In most embodiments, Applicants have realized that one may need two inductors to arrive at a desired inductance. In almost all embodiments, Applicants have realized that separate inductors do not have coupling of fields of each inductor.

In some embodiments, it may be beneficial to be able to tune a load for a High-Q clock buffer. In many embodiments, it may be possible to save power using a tuned LC load. In certain embodiments, it may be beneficial to tune a center frequency of a circuit. In certain embodiments, Applicants have realized it may be possible to tune a center frequency by tuning a capacitor. In other embodiments, Applicants have realized it may be possible to tune a center frequency by tuning an inductor.

In almost all embodiments, Applicants have realized there may be advantages to tuning an inductor instead of a capacitor to change a center frequency. In many embodiments, to change a center frequency with a capacitor may require addition of more capacitors, which may require more power. In almost all embodiments, Applicants have realized it may require a large change in capacitance to tune a load or change a center frequency. In other embodiments, Applicants have realized if inductance is increased to change a center frequency or tune a load, then capacitance may be constant. In many embodiments, Applicants have realized that it may be more power efficient to tune by changing an inductance. Typically, it has been challenging to tune a load by varying inductance.

In many embodiments, with inductors in a clock buffer, there may need to be two inductors with one inductor connected to a positive supply and one inductor connected to ground. In other embodiments, it may be beneficial to tune a load for other applications. In some embodiments, tuning a load may be useful to change a clock frequency or timing. In many embodiments, a single frequency or clock timing may be insufficient for all of a DAC's applications. In most embodiments, a single tuned circuit in the middle of two different frequencies may be insufficient for a DAC.

In certain embodiments, a DAC may need to have two or more frequencies or clock timings. In some embodiments, it may be beneficial to use inductors to tune a load to accommodate different frequencies. In further embodiments, Applicants have realized that it may be beneficial to tune a frequency or change inductance of inductors in a circuit. In certain embodiments, a VCO clock may need to run at different frequencies. In most embodiments, it may be beneficial to be able to tune frequencies in relatively big steps as well as relatively fine ones. In most embodiments, with a back-end buffer, it may be necessary to drive a load and capacitance of the load.

Often, if it is necessary to have inductors of different values, switched variable capacitors are used, which creates a power penalty due to added capacitance, where each switch adds load and parasitic capacitance. Conventionally, with two inductors of 2L separate but in parallel in a circuit, there may be a number of switches in each conductor to change the inductance of each inductor, which requires a set of switches for each inductor. In most embodiments, Applicants have realized that each switch of a set of switches for each inductor can contribute to parasitic capacitance and take up additional space. In most embodiments, too many switches for one or more inductors may negatively impact a circuit. In almost all embodiments, switches may add capacitance even when off. Alternatively, another conventional approach for clock tuning may be to include multiple separate inductors and enable switching between these inductors. Typically, different inductors of different lengths take up additional space for each additional inductor.

In most embodiments, Applicants have realized that if one places two inductors of size L on top of each in different layers of metal, one may need only a single inductor to get an inductor of size L. In certain embodiments, placing two 1L inductors on top of each other in different layers of metal may make the two 1L inductors look like a single 1L inductor. In many embodiments, Applicants have realized that both inductors may be placed in parallel on top of each other by locating each inductor in a different layer of metal of a circuit. In certain embodiments, Applicants have realized that two inductors placed over each other may be beneficial as compared to two separate inductors in parallel in a circuit.

Generally, with two separate inductors in a parallel circuit there are 2 inductor of 2L to be laid out. In certain embodiments, Applicants have realized that if one has 2 inductors of size 2L, this is 3 to 4 times as big as a two single inductor of L placed over each other and the 2L inductors may have too much parasitic value. In almost all embodiments Applicants have realized that the parasitic capacitance of two 1L inductors placed over each other may be ⅓ the parasitic capacitance of two inductors of 2L placed in parallel in a circuit.

In most embodiments, Applicants have realized that in a clock buffer, the same amount of current is often used in both inductors. In almost all embodiments, Applicants have found that parallel conductors with current of the same value running in the same direction in each inductor may cause the inductors to be of the combined value of both of the inductors. In almost all embodiments, Applicants have realized that when a same current going in a same direction is placed through two inductors sitting on top of each other, the inductive field of the inductors couples, producing an inductor of 1L.

In most embodiments, this may enable two inductors in parallel placed over each other to take up a space 3 times smaller than two inductors that are not located in parallel. In certain embodiments, parallel inductors stacked over each other may also have fewer turns than two separately located inductors. In almost all embodiments, parallel inductors stacked in different layers of metal may be implemented in a same area as a single inductor. In most embodiments, Applicants have realized that if current in two parallel inductors are of a different value, the current is running in different directions, or if there is a different current a value for the two stacked parallel inductors may not be twice the value of each inductor in parallel. In other embodiments, Applicants have realized that if there are different currents in two inductors sitting on top of each other or current flowing in different directions, that the inductors may not appear as an inductor of 1L.

In further embodiments, Applicants have realized that it may be possible to tune parallel inductors on top of each other in different levels of metal using one or more switches shared between the conductors spanning different layers of metal. In other embodiments, using switches with parallel inductors layered over each other in metal may be used to tune an overall inductance. In most embodiments, switched inductors in parallel in different layers of metal may be able to reuse switch connections. In many embodiments, turns of inductors may be shorted by one or more switches, altering a coil inductance of the inductor to enable frequency tuning without impacting inductor area.

In most embodiments, tuning an inductor by shorting a switch may enable a load to be set for different clock frequencies of a VCO. In still further embodiments, combinations of switches or multiple switches may be shorted at a same time to provide further tuning. In almost all embodiments, use of parallel inductors layered over each other in different layers of metal with switches may enable use of two inductors at multiple settings in the area of a single inductor of a highest value of the inductor. In most embodiments, Applicants have realized that other solutions may use more silicon area and/or require higher power usage.

In certain embodiments, with two inductors laid over each other in different layers of metal, a single switch may be used to short out or connect both inductors across the layers of metal. In other embodiments, a set of switches may be used with inductors across the layers of metal, where shorting out or connecting both inductors requires only a single switch for two inductors. In most embodiments, a switch may connect a portion of an inductor to ground and a portion of another inductor to VDD.

In still further embodiments, a set of switches may be deployed in different combinations to give different changes in inductance to two inductors layered over each other in two different layers of metal. In almost all embodiments, connecting inductors or shorting together two inductors may change the capacitance of the inductors. In most embodiments, each switch of a set of switches may be located across different turns of two inductors located in different layers of metal. In most embodiments, using a single set of switches, where a single switch is used to tune two inductors, may mean lower power consumption, lower capacitance, and less resistance. In certain embodiments, it may be possible to have the equivalent of many different inductors, within only two inductors with a set of common switches. In almost all embodiments, Applicants have realized that coupling of fields may not be linear between two capacitors in two different layers of metal.

In certain embodiments, setting of switches in a switched capacitor may be performed during a calibration procedure. In some embodiments, a digital signal may control setting of switches on an inductor. In other embodiments, a processor may control setting of which switches are on and which switches are off on inductors. In other embodiments, there may be logic on a chip that may control turning switches for inductors on and off. In further embodiments, a finite state machine may control which switches for inductors may be turned on or off. In further embodiments, an algorithm may find which combination of switches offers the lowest power usage for a given desired frequency or clock setting.

Figure 1:
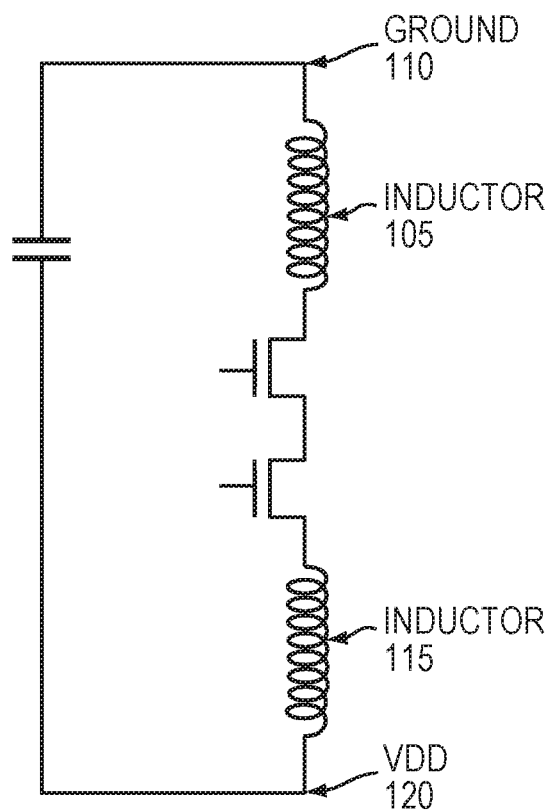
FIG. 1 is a simplified illustration of two inductors in parallel, in accordance with an embodiment of the present disclosure.

Refer now to the example embodiment of FIG. 1, which illustrates two inductors of size 2L together in parallel. In the example embodiment there is inductor 105, which is connected to ground 110 and there is inductor 115 that is connected to VDD 120 or power.

Figure 2:
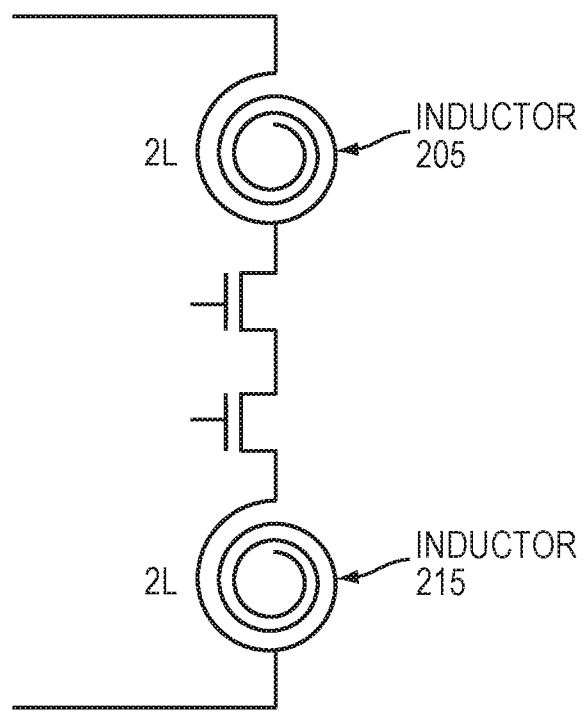
FIG. 2 is an alternative simplified illustration of two inductors in parallel, in accordance with an embodiment of the present disclosure.

Refer now to the example embodiment of FIG. 2, which illustrates an alternative illustration of the inductors in FIG. 1 showing how much floor space is taken up by the inductors. In the example embodiment of FIG. 2, Inductor 205 takes up a particular amount of space and inductor 215, located separately from but in parallel to inductor 205, takes up another amount of floor space. In this example embodiment, inductor 205 has a value of 2L and inductor 215 has a value of 2L, which results, as these inductors are in parallel, in an inductor in the circuit of 1L.

Figure 3:
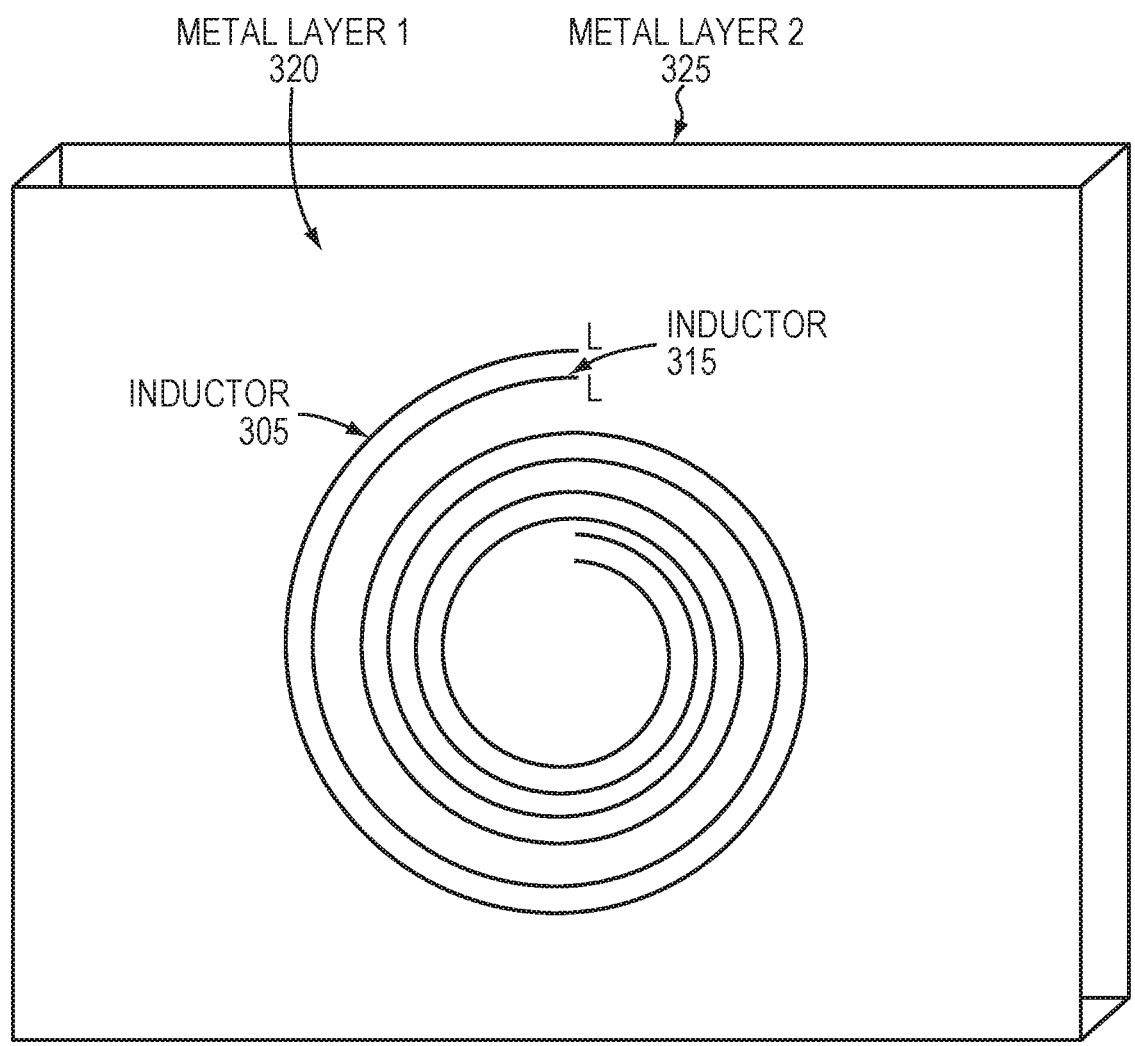
FIG. 3 is a simplified illustration of two inductors in placed over each other in different layers of metal, in accordance with an embodiment of the present disclosure.

Refer now to the example embodiment of FIG. 3, which illustrates two inductors in parallel layered on top of each other in two different layers of metal. In this example embodiment, Inductor 305 is layered in metal layer 1 320. Inductor 315 is located in metal layer 2 325, which is under metal layer 1 320. In this example, embodiment metal layer 1 320 is slightly offset from metal layer 2 325, both of which are illustrated as being transparent, so that it is possible to see through metal layer 1 320 to see inductor 315 in metal layer 2 325. In this example embodiment, if the metal layers were not offset inductor 305 would cover and obscure inductor 315. In this example embodiment, while inductor 305 and 315 are in parallel, and each of size L, the current in both inductors is the same and running in the same direction, which causes the field of the inductors to couple and create an inductor of size L.

Figure 4:
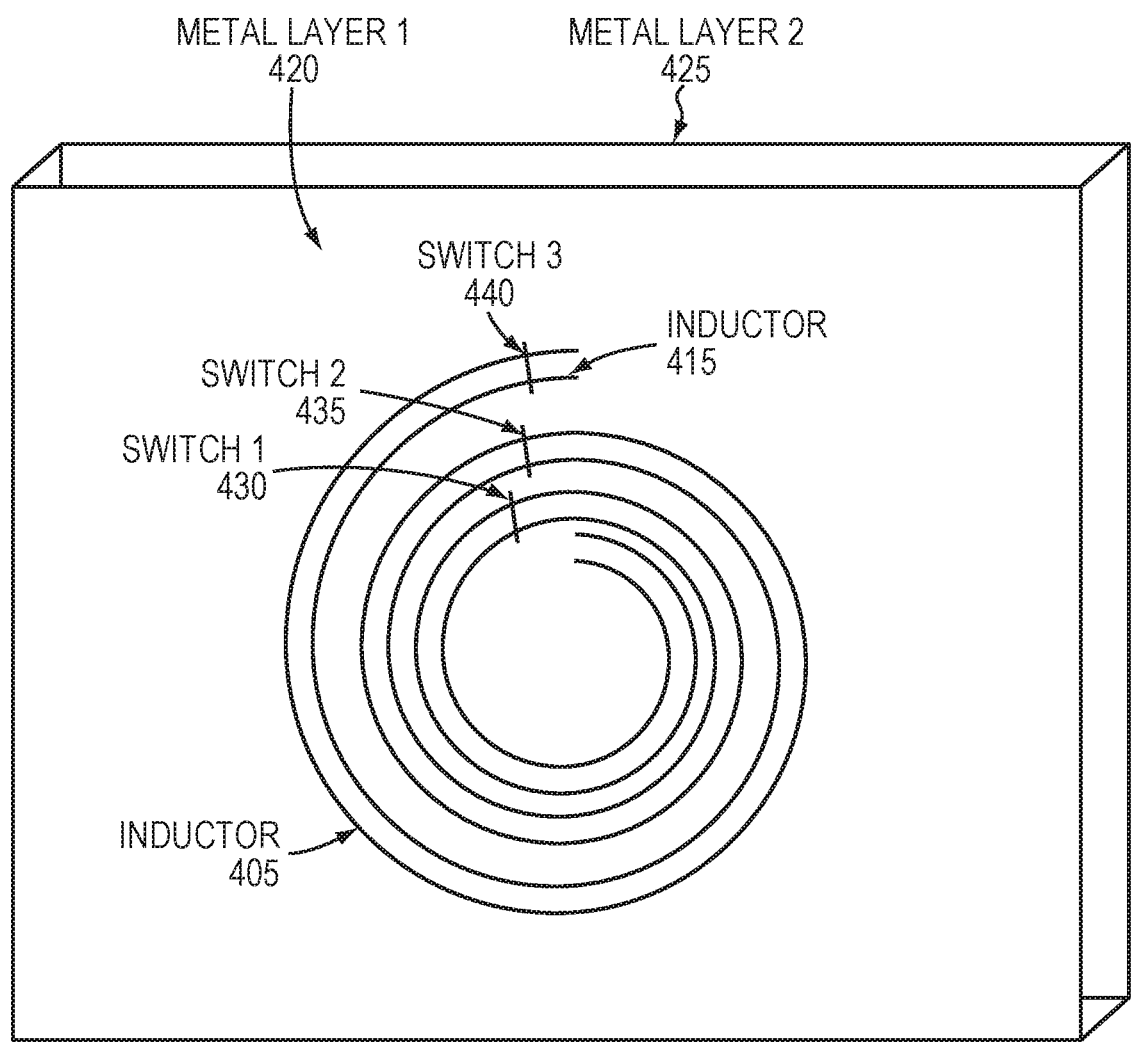
FIG. 4 is a simplified illustration of two inductors in placed over each other in different layers of metal with switches connecting different turns of the inductors, in accordance with an embodiment of the present disclosure.

Refer now to the example embodiment of FIG. 4, which illustrates two inductors in parallel layered on top of each other in two different layers of metal, with switches running across the metal layers. In this example embodiment, inductor 405 and inductor 415 are placed on top of each other in different layers of metal, metal layer 1 420 and metal layer 2 425, respectively. Switch 1 430 connects inductor 405 and inductor 415 at one turn running through metal layer 1 420 and metal layer 2 425. Switch 2 435 connects inductor 405 and inductor 415 at two turns running through metal layer 1 420 and metal layer 2 425. Switch 3 440 connects inductor 405 and inductor 415 at three turns running through metal layer 1 420 and metal layer 2 425. In the example embodiment of FIG. 4, different "inductors" can be created by shorting different switches. Each switch shorts a turn to VDD and to ground.

Refer now to the example embodiment of FIG. 5, which illustrates a simplified physical implementation of two inductors that would be layered on top of each other, but are broken apart and placed next to each other for illustration purposes. In this example embodiment, there are two inductors 505 and 510, each with the same number of turns. Inductor 505 has differential output 515 and Inductor 510 has differential output 520. Inductors 505 and 510 have different portions of their loops able to be shorted together with switch 0 535, switch 2 540, switch 3 545, and switch 1 550. Inductors 505 and 510 have top inductor metal 530 and bottom conductor metal 525.

In the example embodiment of FIG. 5, by using reach respective switch of switches 535, 540, 545, and 550 to short or open the inductor turns, the inductance of inductors 505 and 510 can be changed to set the load resonance for different clock frequencies. As well, different resonant frequency settings are possible by simultaneously shorting switches. Switch 0 535 and switch 1 550 shorted together create a resonant peak mid-way between freq0 and freq1 is achieved. The same is true for switch 2 540 and switch 3 545 as well as other switches. In this example embodiment, the total area used is the same for a single inductor of the highest inductance value (lowest resonant frequency). In the example embodiment of FIG. 5, there is an equivalent of approximately 20 different inductors using only two inductors in a footprint of a single inductor.

Refer now to the example embodiment of FIG. 6, which illustrates a further alternative view of FIG. 4 and FIG. 5. In the example embodiment of FIG. 6, the turns of an inductor have been straightened or unwrapped for illustration purposes to show a stacked inductor with several tap points on the supply/ground side, where the number of turns can be varied depending which switch(es) are closed to connect to VDD/GND. Inductors 600 and 602 are shown as straight lines. Laid out parallel to Inductors 600 and 602 are VDD 604 and ground GND 606. At a first distance switch 615 connects Inductor 600 to VDD 604. At a second distance switch 620 connects Inductor 600 to VDD 604. At a third distance switch 625 connects Inductor 600 to VDD 604. At a fourth distance switch 630 connects Inductor 600 to VDD 604. At a first distance switch 635 connects Inductor 602 to GND 606. At a second distance switch 640 connects Inductor 602 to GND 606. At a third distance switch 645 connects Inductor 602 to GND 606. At a fourth distance switch 650 connects Inductor 602 to GND 606. Connection point 655, 660, 665, and 670 denote connection of inductors to switches.

In the example embodiment of FIG. 6, if SW1 615 and SW5 635 are closed, the maximum inductance is achieved (longest winding/most turns). If SW4 630 and SW8 650 are closed, the minimum inductance is achieved (shortest winding/fewest turns). Other possible values of inductance are possible in between the minimum and maximum inductance depending on the number of switches and how many are closed. In this embodiment, as the VDD/GND are at the end of the windings the parasitic capacitance of the switches has much less effect than if these are placed at the circuit side. In this embodiment, this is because VDD/GND see smaller voltage swings. In this embodiment, if a voltage swing is halved this is equivalent to reducing the capacitance by a factor of 4.

Refer now to the example embodiment of FIG. 7, which illustrates some examples of using different switches, such as those of FIG. 5 or FIG. 6. Graph line 700 shows the frequency response when switch 0 is closed. Graph line 705 shows the frequency response when switch 1 is closed. Graph line 710 shows the frequency response when switch 0 and switch 1 are closed. Graph line 715 shows the frequency response when switch 2 is closed. Graph line 720 shows the frequency response when switch 2 and switch 3 are closed. Graph line 725 shows the frequency response when switch 3 is closed. In this example embodiment, other combinations are possible, including shorting more than 2 switches at a same time, but limited examples have been provided to maintain clarity in the graph.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within +20% of a target value in some embodiments, within +10% of a target value in some embodiments, within +5% of a target value in some embodiments, and yet within +2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. An apparatus comprising:
    two inductors; wherein the two inductors are layered on top of each other in adjoining layers of metal of a circuit spaced to cause the field of the inductors to couple; wherein each inductor of the two inductors has an equal set of turns; wherein the current path of the two inductors is in the same direction, wherein the two inductors have the same inductance; wherein the two inductors are connected in parallel; and a set of switches, wherein each switch of the set of switches is connected to a different turn of the set of turns of a first inductor of the two inductors and to a corresponding turn of the set of turns of a second inductor of the two inductors to create a variable inductor, and wherein an inductance of the variable inductor is to change based on a switch of the set of switches being shorted.

2. The apparatus of claim 1 wherein the inductance of each of the two inductors is enabled to be changed by switching a switch of the set of switches to alter a coil inductance of the inductors by shorting out one or more turns of the set of turns of each of the two inductors.

3. The apparatus of claim 1 wherein a first end of a first inductor of the two inductors is connected to a ground and a first end of a second inductor of the two inductors is connected to a power supply.

4. The apparatus of claim 2 wherein the inductance of each of the two inductors is enabled to be further changed by switching a second switch of the set of switches to alter the coil inductance of the inductors by shorting out one or more turns of the set of turns of each inductor.

5. A system comprising:
    a first inductor;
    a second inductor; wherein the first and second inductors are layered on top of each other in adjoining layers of metal of a circuit spaced to cause the field of the inductors to couple; wherein the first inductor has a set of turns; wherein the second inductor has an equivalent set of turns; wherein the current path of the two inductors is in the same direction, wherein the two inductors have the same inductance; wherein the two inductors are connected in parallel; and
    a set of switches, wherein each switch of the set of switches is connected to a different turn of the set of turns of the first inductor and to a corresponding turn of the set of turns of the second inductor to create a variable inductor, wherein an inductance of the variable inductor is determined based on shorting a switch of the set of switches.

6. The system of claim 5 wherein the inductance of the first inductor and the inductance of the second inductor are enabled to be changed by switching a switch of the set of switches to alter a coil inductance of the first and second inductors by shorting out one or more turns of the set of turns of the first inductor and the second inductor; wherein the switching of the switch causes the first inductor and the second inductor to have the same amount of turns shorted out.

7. The system of claim 5 wherein a first end of the first inductor is connected to a ground and a first end of the second inductor is connected to a power supply.

8. The system of claim 7 wherein the inductance of the first inductor and the inductance of the second inductor are enabled to be further changed by switching a second switch of the set of switches to alter the coil inductance of the inductors by shorting out one or more turns of the set of turns of each inductor.

9. The apparatus of claim 1 wherein when a same current value runs through each of the two inductors, inductive fields of each inductor of the two inductors couples.

10. The system of claim 5 wherein when a same current value runs through the first inductor and the second inductor, an inductive field of the first inductor couples with an inductive field of the second inductor.

11. The apparatus of claim 1 further comprising logic, wherein the setting of each switch of the set of switches is controlled by the logic.

12. The system of claim 5 further comprising logic, where the setting of each switch of the set of switches is controlled by the logic.

13. The apparatus of claim 1 wherein the setting of each switch of the set of switches changes the load of the two inductors.

14. The system of claim 5 wherein the setting of each switch of the set of switches changes the load of the two inductors.

15. The apparatus of claim 1 wherein the equal set of turns of each of the two inductors traverses at least 360 degrees.

16. The system of claim 5 wherein the equal set of turns of each of the two inductors traverses at least 360 degrees.

* * * * *